(12) United States Patent
Kang et al.

(10) Patent No.: US 12,204,366 B2
(45) Date of Patent: Jan. 21, 2025

(54) CLOCK DISTRIBUTION NETWORK, SEMICONDUCTOR DEVICE AND SEMICONDUCTOR SYSTEM INCLUDING THE SAME, AND CLOCK DISTRIBUTION METHOD THEREOF

(71) Applicant: SK hynix Inc., Icheon-si (KR)

(72) Inventors: Ji Hyo Kang, Icheon-si (KR); Kyung Hoon Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 83 days.

(21) Appl. No.: 18/314,656

(22) Filed: May 9, 2023

(65) Prior Publication Data

US 2024/0184323 A1 Jun. 6, 2024

(30) Foreign Application Priority Data

Dec. 6, 2022 (KR) .................. 10-2022-0168870

(51) Int. Cl.
  *G06F 1/10* (2006.01)
  *G06F 1/08* (2006.01)
  *H03K 19/0185* (2006.01)

(52) U.S. Cl.
  CPC .............. *G06F 1/10* (2013.01); *G06F 1/08* (2013.01); *H03K 19/018521* (2013.01)

(58) Field of Classification Search
  CPC ...... G06F 1/08; G06F 1/10; H03K 19/018521
  USPC .................. 327/291, 293, 295, 296, 297
  See application file for complete search history.

(56) References Cited

U.S. PATENT DOCUMENTS

| | | |
|---|---|---|
| 6,897,699 B1 | 5/2005 | Nguyen et al. |
| 2010/0054058 A1* | 3/2010 | Bringivijayaraghavan ................. G11C 8/18 365/194 |
| 2015/0168992 A1 | 6/2015 | Choi |

* cited by examiner

*Primary Examiner* — William Hernandez
(74) *Attorney, Agent, or Firm* — WILLIAM PARK & ASSOCIATES LTD.

(57) ABSTRACT

A clock distribution network includes a global clock tree and a local clock tree. When the clock distribution network is activated, the local clock tree is first activated, and the voltage levels of first and second output clock signals are set as a common mode voltage level. When the global clock tree is activated, the global clock tree generates first and second global clock signals from first and second input clock signals. The local clock tree generates the first and second output clock signals from the first and second global clock signals.

20 Claims, 10 Drawing Sheets

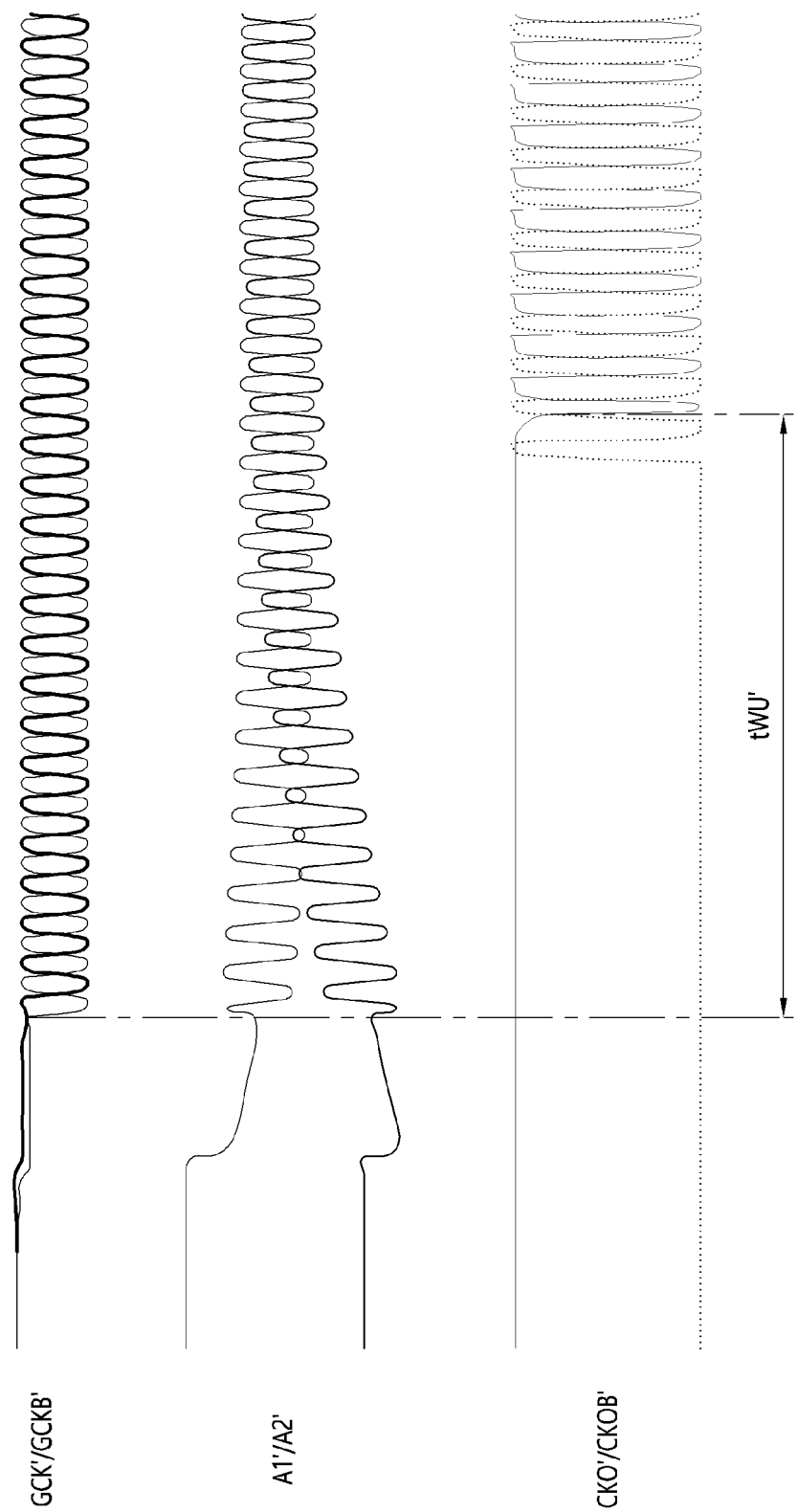

CLOCK DISTRIBUTION NETWORK, SEMICONDUCTOR DEVICE AND SEMICONDUCTOR SYSTEM INCLUDING THE SAME, AND CLOCK DISTRIBUTION METHOD THEREOF

CROSS-REFERENCES TO RELATED APPLICATION

The present application claims priority under 35 U.S.C. § 119(a) to Korean application number 10-2022-0168870, filed on Dec. 6, 2022, in the Korean Intellectual Property Office, which is incorporated herein by reference in its entirety.

BACKGROUND

1. Technical Field

The present technology relates to an integrated circuit technology, and more particularly, to a clock distribution network, a semiconductor device and a semiconductor system including the same, and a clock distribution method thereof.

2. Related Art

Electronic devices include many electronic components. Among the electronic devices, a computer system may include many semiconductor devices. The semiconductor devices that constitute the computer system may communicate with each other by transmitting and/or receiving a system clock signal, a command address signal, and data. The semiconductor devices may synchronize the command address signal and the data with the system clock signal. The semiconductor devices may include an internal clock generation circuit. The internal clock generation circuit may generate a plurality of internal clock signals from the system clock signal. The internal clock generation circuit may distribute the plurality of internal clock signals to a plurality of internal circuits that transmit and/or receive the command address signal and the data.

The semiconductor devices can reduce power consumption by deactivating the internal clock generation circuit when the semiconductor devices operate in a low power mode. However, when the state of the internal clock generation circuit is changed from a deactivation state to an activation state, a long time is taken for the amplitude and/or phase of each of the plurality of internal clock signals that are generated by the internal clock generation circuit to be stabilized. Accordingly, in the case of the internal clock generation circuit that is coupled to the internal circuit that requires the reliability of an operation, it becomes difficult to deactivate the internal clock generation circuit in a low power mode. If the internal clock generation circuit continues to maintain the activation state, power consumption of the semiconductor device may be increased.

SUMMARY

In an embodiment, a clock distribution network may include a wake-up control circuit, a global clock tree, and a local clock tree. The wake-up control circuit may be configured to generate a global enable signal and a local enable signal based on a clock enable signal. The global clock tree may be configured to buffer a first input clock signal and a second input clock signal based on the global enable signal to generate a first global clock signal and a second global clock signal. The local clock tree may be configured to set the voltage levels of a first output clock signal and a second output clock signal as a common mode voltage level based on the local enable signal and the global enable signal and configured to generate the first output clock signal and the second output clock signal from the first and second global clock signals based on the global enable signal.

In an embodiment, a clock distribution network may include a wake-up control circuit, a global clock tree, and a local clock tree. The wake-up control circuit may be configured to generate a global enable signal, a local enable signal, and a common mode enable signal based on a clock enable signal. The global clock tree may be configured to buffer a first input clock signal and a second input clock signal based on the global enable signal to generate a first global clock signal and a second global clock signal. The local clock tree may be configured to set the voltage levels of a first output clock signal and a second output clock signal as opposite logic levels based on the clock enable signal, set the voltage levels of the first and second output clock signals as a common mode voltage level based on the common mode enable signal, and generate the first and second output clock signals from the first and second global clock signals based on the local enable signal.

In an embodiment, a clock distribution network may include a global clock tree and a local clock tree. The global clock tree may be configured to buffer a first input clock signal and a second input clock signal to generate a first global clock signal and a second global clock signal. The local clock tree may be configured to generate a first output clock signal and a second output clock signal from the first and second global clock signals. A clock distribution method of the clock distribution network may include activating the local clock tree and setting, as a common mode voltage level, voltage levels of a first output node and a second output node from which the first and second output clock signals are output, respectively. And the clock distribution method may include releasing a state in which the voltage levels of the first and second output nodes have been set as the common mode voltage level and activating the global clock tree.

BRIEF DESCRIPTION OF THE DRAWINGS

FIG. 5A is a waveform diagram illustrating an operation of a common clock distribution network.

DETAILED DESCRIPTION

Hereinafter, embodiments of the present technology will be described in more detail with reference to the accompanying drawings.

Figure 1:
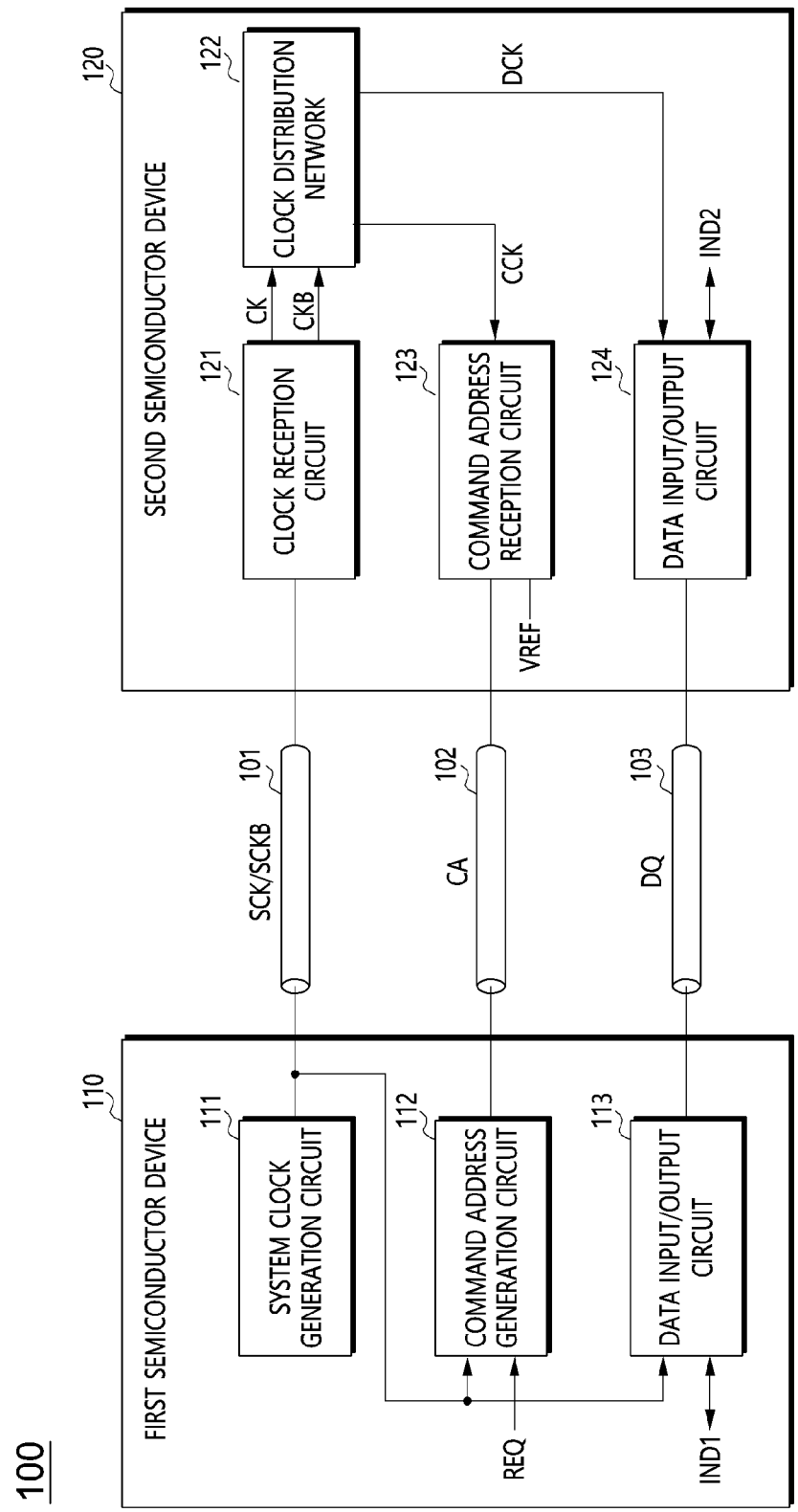
FIG. 1 is a diagram illustrating a construction of a semiconductor system according to an embodiment of the present technology.

FIG. 1 is a diagram illustrating a construction of a semiconductor system 100 according to an embodiment of the present technology. In FIG. 1, the semiconductor system 100 may include a first semiconductor device 110 and a second semiconductor device 120. The first semiconductor device 110 may be a master device for controlling an operation of the second semiconductor device 110. The second semiconductor device 120 may be a slave device capable of performing various operations under the control of the first semiconductor device 110. The first semiconductor device 110 may provide various control signals that are necessary for the second semiconductor device 120 to operate. The first semiconductor device 110 may include various types of host devices. For example, the first semiconductor device 110 may be a host device, such as a central processing unit (CPU), a graphic processing unit (GPU), a multi-media processor (MMP), a digital signal processor, an application processor (AP), a memory controller, and the like. For example, the second semiconductor device 120 may be a memory device. The memory device may include volatile memory and nonvolatile memory. The volatile memory may include static RAM (SRAM), dynamic RAM (DRAM), synchronous DRAM (SDRAM), and the like. The nonvolatile memory may include read only memory (ROM), programmable ROM (PROM), electrically erasable PROM (EEPROM), electrically programmable ROM (EPROM), flash memory, phase change RAM (PRAM), magnetic RAM (MRAM), resistive RAM (RRAM), ferroelectric RAM (FRAM), and the like.

The second semiconductor device 120 may be coupled to the first semiconductor device 110 through a plurality of buses. The plurality of buses may be a signal transmission path, link, or channel for transmitting a signal. The plurality of buses may include a clock bus 101, a command address bus 102, and a data bus 103. The clock bus 101 and the command address bus 102 may be unidirectional buses from the first semiconductor device 110 to the second semiconductor device 120. The data bus 103 may be a bidirectional bus. The second semiconductor device 120 may be coupled to the first semiconductor device 110 through the clock bus 101 and may receive a system clock signal SCK from the first semiconductor device 110. The system clock signal SCK may be a differential signal along with a complementary signal SCKB and may be transmitted through the clock bus 101. The second semiconductor device 120 may be coupled to the first semiconductor device 110 through the command address bus 102 and may receive a command address signal CA from the first semiconductor device 110. The command address signal CA may include a plurality of signal sets including a plurality of bits. The second semiconductor device 120 may receive the command address signal CA based on the system clock signal SCK. The second semiconductor device 120 may be coupled to the first semiconductor device 110 through the data bus 103, and the second semiconductor device 120 may receive data DQ from the first semiconductor device 110 or may transmit the data DQ to the first semiconductor device 110.

The first semiconductor device 110 may include a system clock generation circuit 111, a command address generation circuit 112, and a data input/output circuit 113. The system clock generation circuit 111 may generate the system clock signal SCK and the complementary signal SCKB. The system clock generation circuit 111 may include any clock generator for generating the system clock signal SCK. For example, the system clock generation circuit may include an oscillator, a phase-locked loop circuit, or a delay-locked loop circuit. The system clock generation circuit 111 may generate the system clock signal SCK having a frequency that is suitable for the first and second semiconductor devices 110 and 120 to communicate with each other. The system clock generation circuit 111 may transmit the system clock signal SCK and the complementary signal SCKB to the second semiconductor device 120 through the clock bus 101. The system clock generation circuit 111 may provide the system clock signal SCK and the complementary signal SCKB to at least one of the command address generation circuit 112 and the data input/output circuit 113.

The command address generation circuit 112 may generate the command address signal CA based on a request REQ. The command address generation circuit 112 may generate the command address signal CA that instructs the second semiconductor device 120 to perform various operations according to the request REQ. The command address generation circuit 112 may transmit the command address signal CA to the second semiconductor device 120 through the command address bus 102. The command address generation circuit 112 may receive the system clock signal SCK and may transmit the command address signal CA to the command address bus 102 in synchronization with the system clock signal SCK.

The data input/output circuit 113 may be coupled to the second semiconductor device 120 through the data bus 103, and the data input/output circuit 113 may transmit the data DQ to the second semiconductor device 120 through the data bus 103 or may receive the data DQ that is transmitted by the second semiconductor device 120 through the data bus 103. The data input/output circuit 113 may receive the system clock signal SCK and may perform a data input/output operation in synchronization with the system clock signal SCK. The data input/output circuit 113 may transmit internal data IND1 of the first semiconductor device 110 as the data DQ in synchronization with the system clock signal SCK. The second semiconductor device 120 may transmit the data DQ to the data input/output circuit 113 in synchronization with the system clock signal SCK, and the data input/output circuit 113 may generate the internal data IND1 of the first semiconductor device 110 based on the received data.

The second semiconductor device 120 may include a clock reception circuit 121, a clock distribution network 122, a command address reception circuit 123, and a data input/output circuit 124. The clock reception circuit 121 may be coupled to the clock bus 101 and may receive the system clock signal SCK that is transmitted by the first semiconductor device 110 through the clock bus 101. The clock reception circuit 121 may receive the system clock signal SCK by differentially amplifying the system clock signal SCK and the complementary signal SCKB. The clock reception circuit 121 may generate a reference clock signal pair CK and CKB by receiving the system clock signal SCK and the complementary signal SCKB. The reference clock signal pair CK and CKB may be provided to the clock distribution network 122.

The clock distribution network 122 may be coupled to the clock reception circuit 121 and may receive the reference clock signal pair CK and CKB from the clock reception circuit 121. In an embodiment, the clock reception circuit 121 may be integrated into the clock distribution network 122. The clock distribution network 122 may generate a plurality of internal clock signals based on the reference clock signal pair CK and CKB. The plurality of internal clock signals may include a command clock signal CCK and a data clock signal DCK. The clock distribution network 122 may distribute the plurality of internal clock signals to the internal circuits of the second semiconductor device 120. The clock distribution network 122 may provide the command clock signal CCK to the command address reception circuit 123 and may provide the data clock signal DCK to the data input/output circuit 124. The data clock signal DCK may have a higher frequency than the command clock signal CCK. The clock distribution network 122 may include a frequency divider, such as a clock divider, in order to generate the plurality of internal clock signals having different frequencies from the system clock signal pair SCK and SCKB and/or the reference clock signal pair CK and CKB. The clock distribution network 122 may include a plurality of clock trees for distributing the plurality of internal clock signals.

The command address reception circuit 123 may be coupled to the command address bus 102 and may receive the command address signal CA that is transmitted by the first semiconductor device 110 through the command address bus 120. The command address reception circuit 123 may receive a reference voltage VREF and may receive the command address signal CA by differentially amplifying the command address signal CA and the reference voltage VREF. The command address reception circuit 123 may receive the command clock signal CCK from the clock distribution network 122. The command address reception circuit 123 may synchronize the received command address signal with the command clock signal CCK by latching the received command address signal CA in synchronization with the command clock signal CCK.

The data input/output circuit 124 may be coupled to the first semiconductor device 110 through the data bus 103, and the data input/output circuit 124 may transmit the data DQ to the first semiconductor device 110 through the data bus 103 or may receive the data DQ that is transmitted by the first semiconductor device 110 through the data bus 103. The data input/output circuit 124 may receive the data clock signal DCK from the clock distribution network 122 and may perform a data input/output operation in synchronization with the data clock signal DCK. The data input/output circuit 124 may transmit internal data IND2 of the second semiconductor device 120 as the data DQ in synchronization with the data clock signal DCK. The data input/output circuit 124 may receive the data DQ that is transmitted by the first semiconductor device 110 in synchronization with the data clock signal DCK and may generate the internal data IND2 of the second semiconductor device 120 based on the received data.

Figure 2:
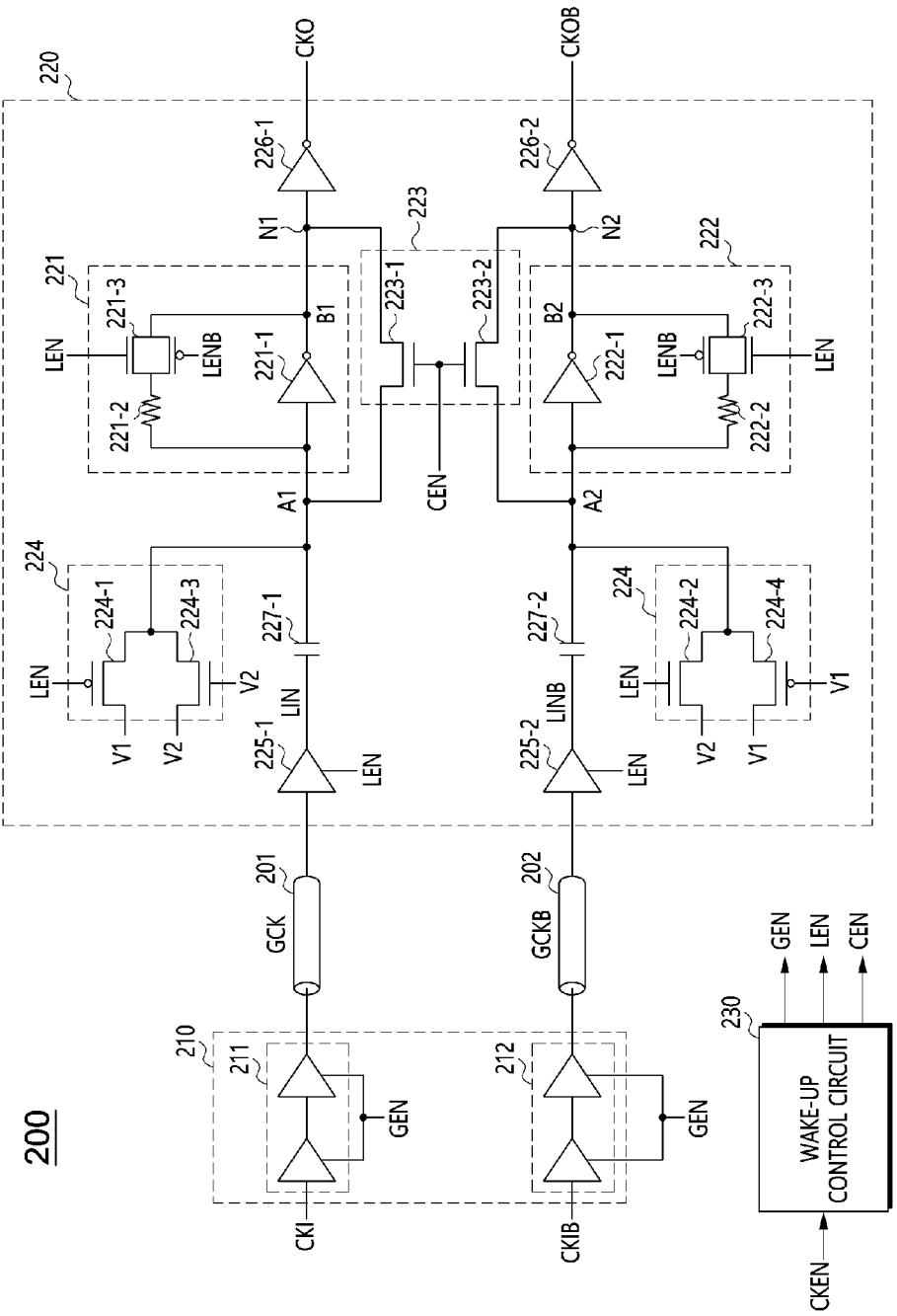
FIG. 2 is a diagram illustrating a construction of a clock distribution network according to an embodiment of the present technology.

FIG. 2 is a diagram illustrating a construction of a clock distribution network 200 according to an embodiment of the present technology. The clock distribution network 200 may be applied as the clock distribution network 122, illustrated in FIG. 1. Referring to FIG. 2, the clock distribution network 200 may receive a first input clock signal CKI and a second input clock signal CKIB and may generate a first output clock signal CKO and a second output clock signal CKOB. The first and second input clock signals CKI and CKIB may be signals that swing at a current mode logic (CML) level and may be a differential clock signal pair. The first and second output clock signals CKO and CKOB may be signals that swing at a complementary metal-oxide-semiconductor (CMOS) level and may be a differential clock signal pair. The clock distribution network 200 may generate the first and second output clock signals CKO and CKOB by converting the swing range of the first and second input clock signals CKI and CKIB from the CML level to the CMOS level. When the clock distribution network 200 is applied as the clock distribution network 122 as illustrated in FIG. 1, the first and second input clock signals CKI and CKIB may correspond to the reference clock signal pair CK and CKB or a division clock signal pair that is generated by dividing the reference clock signal pair CK and CKB. The first and second output clock signals CKO and CKOB may correspond to at least one of the command clock signal CCK and the data clock signal DCK.

The clock distribution network 200 may include a global clock tree 210, a local clock tree 220, and a wake-up control circuit 230. The global clock tree 210 may generate a first global clock signal GCK and a second global clock signal GCKB by receiving the first and second input clock signals CKI and CKIB. The global clock tree 210 may buffer the first and second input clock signals CKI and CKIB and may generate the first and second global clock signals GCK and GCKB. The first and second global clock signals GCK and GCKB may be a differential signal pair. The global clock tree 210 may generate the first and second global clock signals GCK and GCKB by buffering the first and second input clock signals CKI and CKIB to the CML level. The first and second global clock signals GCK and GCKB may be signals that swing at the CML level. The global clock tree 210 may receive a global enable signal GEN and may be selectively activated based on the global enable signal GEN. When the global enable signal GEN is enabled, the global clock tree 210 may be activated and may generate the first and second global clock signals GCK and GCKB based on the first and second input clock signals CKI and CKIB. When the global enable signal GEN is disabled, the global clock tree 210 may be deactivated and might not generate the first and second global clock signals GCK and GCKB. The first global clock signal GCK may be transmitted through a first clock transmission line 201 and distributed to the local clock tree 220. The second global clock signal GCKB may be transmitted through a second clock transmission line 202 and distributed to a local clock tree 220. The first and second clock transmission lines 201 and 202 may be internal signal transmission lines that are disposed within a single semiconductor device. In an embodiment, the first and second clock transmission lines 201 and 202 may be signal transmission lines that enable one semiconductor device to be coupled to another semiconductor device within a single package.

The local clock tree 220 may be coupled to the first and second clock transmission lines 201 and 202 and may receive the first and second global clock signals GCK and GCKB through the first and second clock transmission lines 201 and 202. The local clock tree 220 may generate the first output clock signal CKO and the second output clock signal CKOB from the first and second global clock signals GCK and GCKB. The local clock tree 220 may generate the first and second output clock signals CKO and CKOB that swing at the CMOS level by converting the first and second global clock signals GCK and GCKB that swing at the CML level. The local clock tree 220 may generate the first output clock signal CKO by converting the swing range of the first global clock signal GCK to the CMOS level and may generate the second output clock signal CKOB by converting the swing range of the second global clock signal GCKB to the CMOS level. The local clock tree 220 may receive a local enable signal LEN and may be selectively activated based on the local enable signal LEN. When the local enable signal LEN is enabled, the local clock tree 220 may be activated and may generate the first and second output clock signals CKO and CKOB from the first and second global clock signals GCK and GCKB. When the local enable signal LEN is disabled, the local clock tree 220 may be deactivated or partially activated and may set the voltage levels of the first and second output clock signals CKO and CKOB as predetermined voltage levels.

The wake-up control circuit 230 may receive a clock enable signal CKEN and may generate the global enable signal GEN and the local enable signal LEN based on the clock enable signal CKEN. The clock enable signal CKEN may be a signal that determines an operation mode of a semiconductor device including the clock distribution network 200. For example, when the semiconductor device operates in a low power mode or a standby mode, the clock enable signal CKEN may be disabled. When the semiconductor device operates in another mode other than the low power mode or the standby mode (e.g., when the semiconductor device performs a data input/output operation), the clock enable signal CKEN may be enabled. The clock enable signal CKEN may be one of the control signals that are provided from the first semiconductor device 110 to the second semiconductor device 120 as illustrated in FIG. 1. When the clock enable signal CKEN is disabled, the wake-up control circuit 230 may disable both the global enable signal GEN and the local enable signal LEN. When the clock enable signal CKEN is enabled, the wake-up control circuit 230 may enable the local enable signal LEN and the global enable signal GEN. The wake-up control circuit 230 may sequentially enable the local enable signal LEN and the global enable signal GEN. When the clock enable signal CKEN is enabled, the wake-up control circuit 230 may enable the global enable signal GEN after enabling the local enable signal LEN. A time at which the local enable signal LEN is enabled to a time at which the global enable signal GEN is enabled may be arbitrarily set. The wake-up control circuit 230 may further generate a common mode enable signal CEN. The wake-up control circuit 230 may be enabled when the clock enable signal CKEN and/or the local enable signal LEN is enabled, and may be disabled when the global enable signal GEN is enabled.

Figure 3:
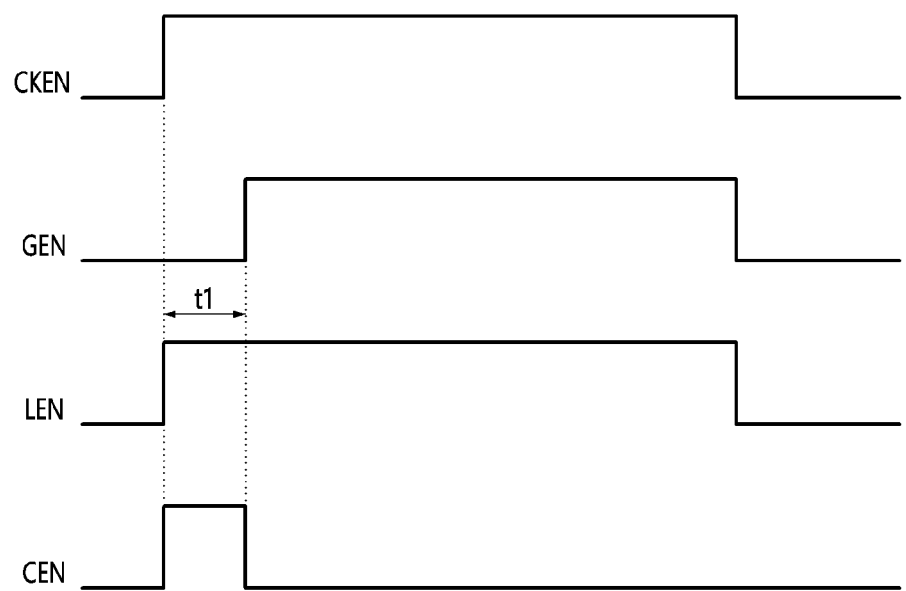
FIG. 3 is a timing diagram illustrating an operation of a wake-up control circuit illustrated in FIG. 2.

FIG. 3 is a timing diagram illustrating an operation of the wake-up control circuit 230 as illustrated in FIG. 2. Referring to FIG. 3, when the clock enable signal CKEN is in a disable state, the wake-up control circuit 230 may maintain all of the global enable signal GNE, the local enable signal LEN, and the common mode enable signal CEN in the disable state. When the clock enable signal CKEN is enabled, the wake-up control circuit 230 may maintain the disable state of the global enable signal GEN but may enable the local enable signal LEN and the common mode enable signal CEN. When a predetermined time "t1" elapses, the wake-up control circuit 230 may enable the global enable signal GEN and may disable the common mode enable signal CEN. The common mode enable signal CEN may have a pulse width corresponding to the predetermined time "t1". In an embodiment, the common mode enable signal CEN may have a pulse width corresponding to a time that is shorter or longer than the predetermined time "t1".

Referring back to FIG. 2, the local clock tree 220 may perform various operations by being controlled by the wake-up control circuit 230. The local clock tree 220 may set the voltage levels of a first output node N1 and a second output node N2 as a common mode voltage level based on the local enable signal LEN and the global enable signal GEN. The first output clock signal CKO may be output through the first output node N1, and the second output clock signal CKOB may be output through the second output node N2. The common mode voltage level may be a middle voltage level between a first voltage V1 and a second voltage V2. For example, the common mode voltage level may be a voltage level corresponding to half of the sum of the first and second voltages ((V1+V2)/2). The first voltage V1 may have a higher voltage level than the second voltage V2. For example, the first voltage V1 may be a power supply voltage, and the second voltage V2 may be a ground voltage. The global clock tree 210 and the local clock tree 220 may receive the first and second voltages V1 and V2 as an operating voltage. The local clock tree 220 may receive the common mode enable signal CEN and may set the voltage levels of the first and second output nodes N1 and N2 as the common mode voltage level based on the common mode enable signal CEN. When the common mode enable signal CEN is enabled (i.e., when the local enable signal LEN is enabled and the global enable signal GEN is disabled), the local clock tree 220 may set the voltage levels of the first and second output nodes N1 and N2 as the common mode voltage level. When the common mode enable signal CEN is disabled (i.e., when the global enable signal GEN is enabled after the local enable signal LEN is enabled), the local clock tree 220 may release the state in which the voltage levels of the first and second output clock signals CKO and CKOB have been set as the common mode voltage level and may generate the first and second output clock signals CKO and CKOB by receiving the first and second global clock signals GCK and GCKB from the global clock tree 210. When the clock enable signal CKEN is disabled, the local clock tree 220 may precharge the first and second output nodes N1 and N2. When the clock enable signal CKEN and/or the local enable signal LEN is disabled, the local clock tree 220 may perform a precharge operation of setting the voltage levels of the first and second output nodes N1 and N2 as opposite logic levels. For example, the local clock tree 220 may set the voltage level of the first output node N1 as the voltage level of the second voltage V2 and may precharge the voltage level of the second output node N2 to the voltage level of the first voltage V1.

The global clock tree 210 may include a first global buffer 211 and a second global buffer 212. The first global buffer 211 may receive the global enable signal GEN and the first input clock signal CKI and may generate the first global clock signal GCK by buffering the first input clock signal CKI based on the global enable signal GEN. When the global enable signal GEN is enabled, the first global buffer 211 may generate the first global clock signal GCK by buffering the first input clock signal CKI to the CML level. When the global enable signal GEN is disabled, the first global buffer 211 might not generate the first global clock signal GCK. The first global buffer 211 may include a plurality of CML buffers that are sequentially coupled in series. The plurality of CML buffers may generate the first global clock signal GCK by sequentially buffering the first input clock signal CKI. The plurality of CML buffers may be selectively activated based on the global enable signal GEN. In FIG. 2, the first global buffer 211 may include two CML buffers, but the disclosure is not limited thereto. For example, the first global buffer 211 may include any even number of CML buffers.

The second global buffer 212 may receive the global enable signal GEN and the second input clock signal CKIB and may generate the second global clock signal GCKB by buffering the second input clock signal CKIB based on the global enable signal GEN. When the global enable signal GEN is enabled, the second global buffer 212 may generate the second global clock signal GCKB by buffering the second input clock signal CKIB to the CML level. When the global enable signal GEN is disabled, the second global buffer 212 might not generate the second global clock signal GCKB. The second global buffer 212 may include a plurality of CML buffers that are sequentially coupled in series. The plurality of CML buffers may generate the second global clock signal GCKB by sequentially buffering the second input clock signal CKIB. The plurality of CML buffers may be selectively activated based on the global enable signal GEN. In FIG. 2, the second global buffer 212 may include two CML buffers, but the disclosure is not limited thereto. For example, the number of CML buffers that are included in the second global buffer 212 may be any even number of CML buffers. The number of CML buffers that are included in the second global buffer 212 may be substantially the same as the number of CML buffers that are included in the first global buffer 212.

The local clock tree 220 may include a first converter 221, a second converter 222, and a common mode setting circuit 223. The first converter 221 may receive the local enable signal LEN and the first global clock signal GCK and may generate the first output clock signal CKO from the first global clock signal GCK based on the local enable signal LEN. The first converter 221 may be a CML to CMOS converter. The first converter 221 may convert the first global clock signal GCK that swings at the CML level to the first output clock signal CKO that swings at the CMOS level. When the local enable signal LEN is enabled, the first converter 221 may generate the first output clock signal CKO by converting the first global clock signal GCK. When the local enable signal LEN is disabled, the first converter 221 might not generate the first output clock signal CKO from the first global clock signal GCK.

The first converter 221 may include a first inverter 221-1, a first resistor 221-2, and a first pass gate 221-3. An input terminal of the first inverter 221-1 may be an input terminal A1 of the first converter 221 and may receive the first global clock signal GCK. The first inverter 221-1 may invert and drive a signal that is input to the input terminal A1. One end of the first resistor 221-2 may be coupled to the input terminal of the first inverter 221-1. The first pass gate 221-3 may be coupled between the other end of the first resistor 221-2 and an output terminal of the first inverter 221-1. The output terminal of the first inverter 221-1 may be an output terminal B1 of the first converter 221. The first pass gate 221-3 may receive the local enable signal LEN. When the local enable signal LEN is enabled to a high logic level and a complementary signal LENB is disabled to a low logic level, the first pass gate 221-3 may activate a feedback loop that sequentially couples the output terminal of the first inverter 221-1, the first resistor 221-2, and the input terminal of the first inverter 221-1, by coupling the output terminal of the first inverter 221-1 to the other end of the first resistor 221-2. When the local enable signal LEN is disabled to a low logic level and the complementary signal LENB is enabled to a high logic level, the first pass gate 221-3 may deactivate the feedback loop by electrically separating the output terminal of the first inverter 221-1 from the other end of the first resistor 221-2. The components of the first converter 221 are merely an example. Any CML to CMOS converter may be modified to be selectively activated based on the local enable signal LEN and may be applied and/or adopted as the first converter 221.

The second converter 222 may receive the local enable signal LEN and the second global clock signal GCKB and may generate the second output clock signal CKO from the second global clock signal GCKB based on the local enable signal LEN. The second converter 222 may be a CML to CMOS converter. The second converter 222 may convert the second global clock signal GCKB that swing at the CML level to the second output clock signal CKOB that swings at the CMOS level. When the local enable signal LEN is enabled, the second converter 222 may generate the second output clock signal CKOB by converting the second global clock signal GCKB. When the local enable signal LEN is disabled, the second converter 222 might not generate the second output clock signal CKOB from the second global clock signal GCKB.

The second converter 222 may include a second inverter 222-1, a second resistor 222-2, and a second pass gate 222-3. An input terminal of the second inverter 222-1 may be an input terminal A2 of the second converter 222 and may receive the second global clock signal GCKB. The second inverter 222-1 may invert and drive the second global clock signal GCKB. One end of the second resistor 222-2 may be coupled to the input terminal of the second inverter 222-1. The second pass gate 222-3 may be coupled between the other end of the second resistor 222-2 and an output terminal of the second inverter 222-1. The output terminal of the second inverter 222-1 may be an output terminal B2 of the second converter 222. The second pass gate 222-3 may receive the local enable signal LEN. When the local enable signal LEN is enabled to a high logic level and the complementary signal LENB is disabled to a low logic level, the second pass gate 222-3 may activate a feedback loop that sequentially couples the output terminal of the second inverter 222-1, the second resistor 222-2, and the input terminal of the second inverter 222-1, by coupling the output terminal of the second inverter 222-1 to the other end of the second resistor 222-2. When the local enable signal LEN is disabled to a low logic level and the complementary signal LENB is enabled to a high logic level, the second pass gate 222-3 may deactivate the feedback loop by electrically separating the output terminal of the second inverter 222-1 from the other end of the second resistor 222-2. The second converter 222 may have substantially the same construction as the first converter 221 and may perform substantially the same function as the first converter 221.

The common mode setting circuit 223 may set the voltage levels of the first and second output nodes N1 and N2 as the common mode voltage level by receiving the common mode enable signal CEN. The common mode setting circuit 223 may selectively couple the input terminal A1 and output terminal B1 of the first converter 221 based on the common mode enable signal CEN. The common mode setting circuit 223 may selectively couple the input terminal A2 and output terminal B2 of the second converter 222 based on the common mode enable signal CEN. When the common mode enable signal CEN is enabled, the common mode setting circuit 223 may equalize the voltage levels of the input terminal A1 and output terminal B1 of the first converter 221 by coupling the input terminal A1 and output terminal B1 of the first converter 221 and may set the voltage level of the first output node N1 as the common mode voltage level.

Furthermore, the common mode setting circuit 223 may equalize the voltage levels of the input terminal A2 and output terminal B2 of the second converter 222 by coupling the input terminal A2 and output terminal B2 of the second converter 222 and may set the voltage level of the second output node N2 as the common mode voltage level. When the common mode enable signal CEN is disabled, the common mode setting circuit 223 may electrically separate the input terminal A1 and output terminal B1 of the first converter 221 and may electrically separate the input terminal A2 and output terminal B2 of the second converter 222.

The common mode setting circuit 223 may include a first transistor 223-1 and a second transistor 223-2. The first and second transistors 223-1 and 223-2 may be N channel MOS transistors. The first transistor 223-1 may be coupled between the input terminal A1 and output terminal B1 of the first converter 221. A gate of the first transistor 223-1 may receive the common mode enable signal CEN. When the common mode enable signal CEN is enabled to a high logic level, the first transistor 223-1 may couple the input terminal A1 to output terminal B1 of the first converter 221. The second transistor 223-2 may be coupled between the input terminal A2 and output terminal B2 of the second converter 222. A gate of the second transistor 223-2 may receive the common mode enable signal CEN. When the common mode enable signal CEN is enabled to a high logic level, the second transistor 223-2 may couple the input terminal A2 to output terminal B2 of the second converter 222.

The local clock tree 220 may further include a precharge circuit 224. The precharge circuit 224 may receive the local enable signal LEN and may precharge the voltage levels of the input terminals A1 and A2 of the first and second converters 221 and 222 to opposite logic levels based on the local enable signal LEN. When the local enable signal LEN is disabled, the precharge circuit 224 may precharge the voltage levels of the input terminal A1 of the first converter 221 and the input terminal A2 of the second converter 222 to opposite logic levels. When the local enable signal LEN is enabled, the precharge circuit 224 may stop the precharge operation and might not drive the input terminals A1 and A2 of the first and second converters 221 and 222. For example, the precharge circuit 224 may precharge the voltage level of the input terminal A1 of the first converter 221 to the first voltage V1 and may precharge the voltage level of the input terminal A2 of the second converter 222 to the second voltage V2. In an embodiment, the precharge circuit 224 may precharge the voltage level of the input terminal A1 of the first converter 221 to the second voltage V2 and may also precharge the voltage level of the input terminal A2 of the second converter 222 to the first voltage V1.

The precharge circuit 224 may include a first transistor 224-1 and a second transistor 224-2. The first transistor 224-1 may be a P channel MOS transistor. A gate of the first transistor 224-1 may receive the local enable signal LEN. A source of the first transistor 224-1 may receive the first voltage V1. A drain of the first transistor 224-1 may be coupled to the input terminal A1 of the first converter 221. When the local enable signal LEN is disabled to a low logic level, the first transistor 224-1 may precharge the voltage level of the input terminal A1 of the first converter 221 to the voltage level of the first voltage V1 by providing the first voltage V1 to the input terminal A1 of the first converter 221. The second transistor 224-2 may be an N channel MOS transistor. A gate of the second transistor 224-2 may receive the complementary signal LENB of the local enable signal. A source of the second transistor 224-2 may receive the second voltage V2. A drain of the second transistor 224-2 may be coupled to the input terminal A2 of the second converter 222. When the complementary signal LENB is enabled to a high logic level, the second transistor 224-2 may precharge the voltage level of the input terminal A2 of the second converter 222 to the voltage level of the second voltage V2 by providing the second voltage V2 to the input terminal A2 of the second converter 222.

The precharge circuit 224 may further include a third transistor 224-3 and a fourth transistor 224-4. The third transistor 224-3 may be an N channel MOS transistor. A gate and source of the third transistor 224-3 may receive the second voltage V2. A drain of the third transistor 224-3 may be coupled to the input terminal A1 of the first converter 221. The fourth transistor 224-4 may be a P channel MOS transistor. A gate and source of the fourth transistor 224-4 may receive the first voltage V1. A drain of the fourth transistor 224-4 may be coupled to the input terminal A2 of the second converter 222. Because the gate of the third transistor 224-3 receives the second voltage V2 and the gate of the fourth transistor 224-4 receives the first voltage V1, the third and fourth transistors 224-3 and 224-4 may continue to maintain an OFF state. The third and fourth transistors 224-3 and 224-4 may be provided in order to compensate for a mismatch between the first transistor 224-1 that precharges the voltage level of the input terminal A1 of the first converter 221 and the second transistor 224-2 that precharges the voltage level of the input terminal A2 of the second converter 222, and the third and fourth transistors 224-3 and 224-4 may be components that may be selectively added.

The local clock tree 220 may further include a first CML buffer 225-1, a second CML buffer 225-2, a third inverter 226-1, and a fourth inverter 226-2. The first CML buffer 225-1 may be coupled between the first clock transmission line 201 and the first converter 221. The first CML buffer 225-1 may buffer the first global clock signal GCK having the CML level and may provide a buffered signal LIN to the input terminal A1 of the first converter 221. The first CML buffer 225-1 may receive the local enable signal LEN and may be selectively activated based on the local enable signal LEN. When the local enable signal LEN is enabled, the first CML buffer 225-1 may be activated and may provide the buffered signal LIN to the first converter 221 by buffering the first global clock signal GCK. When the local enable signal LEN is disabled, the first CML buffer 225-1 may be deactivated and may block the first global clock signal GCK from being provided to the first converter 221.

The second CML buffer 225-2 may be coupled between the second clock transmission line 202 and the second converter 222. The second CML buffer 225-2 may buffer the second global clock signal GCKB having the CML level and may provide a buffered signal LINB to the input terminal A2 of the second converter 222. The second CML buffer 225-2 may receive the local enable signal LEN and may be selectively activated based on the local enable signal LEN. When the local enable signal LEN is enabled, the second CML buffer 225-2 may be activated and may provide the buffered signal LINB to the second converter 222 by buffering the second global clock signal GCKB. When the local enable signal LEN is disabled, the second CML buffer 225-2 may be deactivated and may block the second global clock signal GCKB from being provided to the second converter 222.

The third inverter 226-1 may be coupled to the first output node N1 and/or output terminal B1 of the first converter 221 and may output the first output clock signal CKO by inverting and driving the output signal of the first converter 221. The fourth inverter 226-2 may be coupled to the second output node N2 and/or output terminal B2 of the second converter 222 and may output the second output clock signal CKOB by inverting and driving the output signal of the second converter 222. The local clock tree 220 may further include a first capacitor 227-1 and a second capacitor 227-2. The first capacitor 227-1 may be coupled between an output terminal of the first CML buffer 225-1 and the input terminal A1 of the first converter 221. The second capacitor 227-2 may be coupled between an output terminal of the second CML buffer 225-2 and the input terminal A2 of the second converter 222.

Figure 4A:
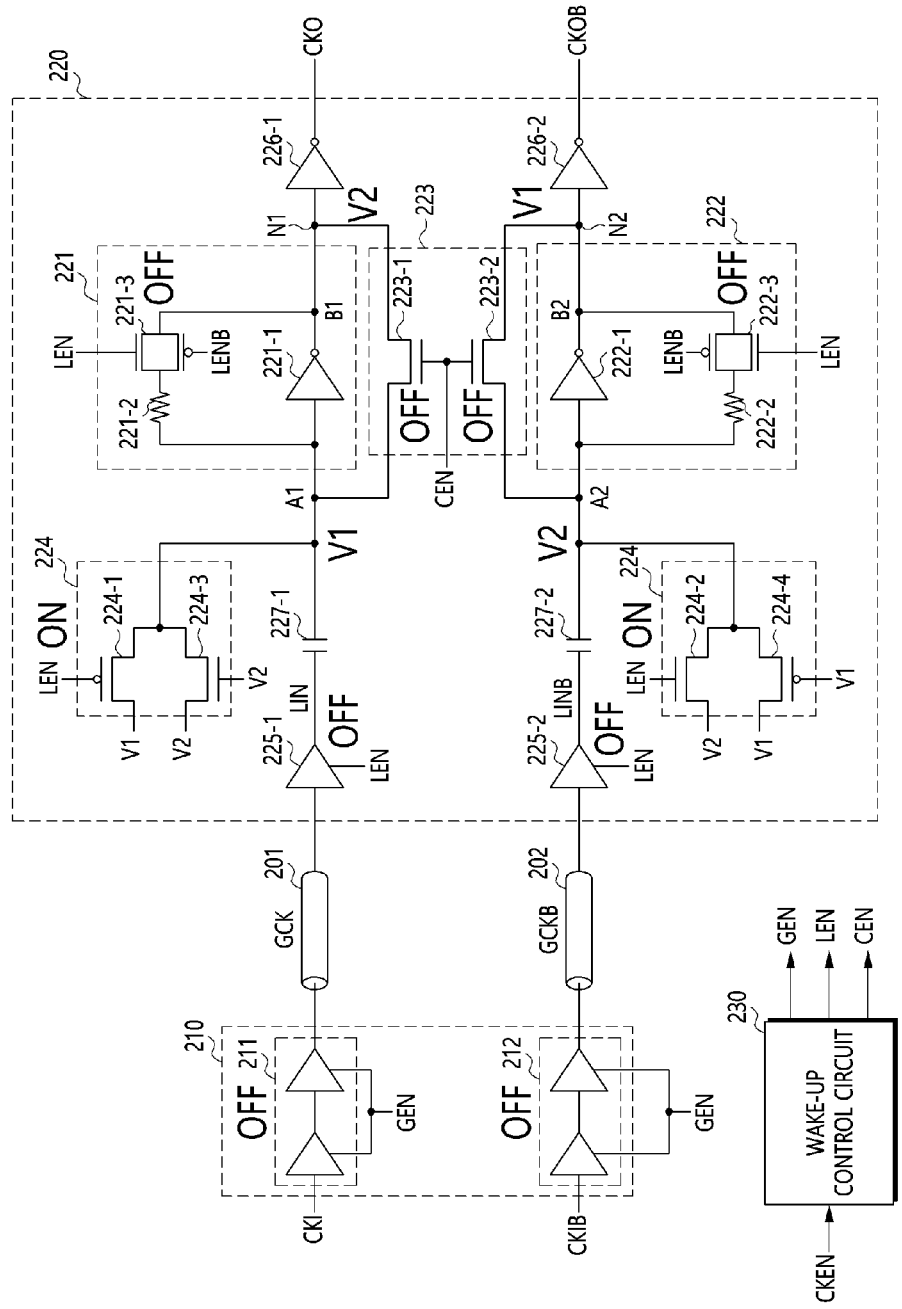
FIGS. 4A, 4B, and 4C are diagrams illustrating an operation of the clock distribution network according to an embodiment of the present technology.
Figure 4B:
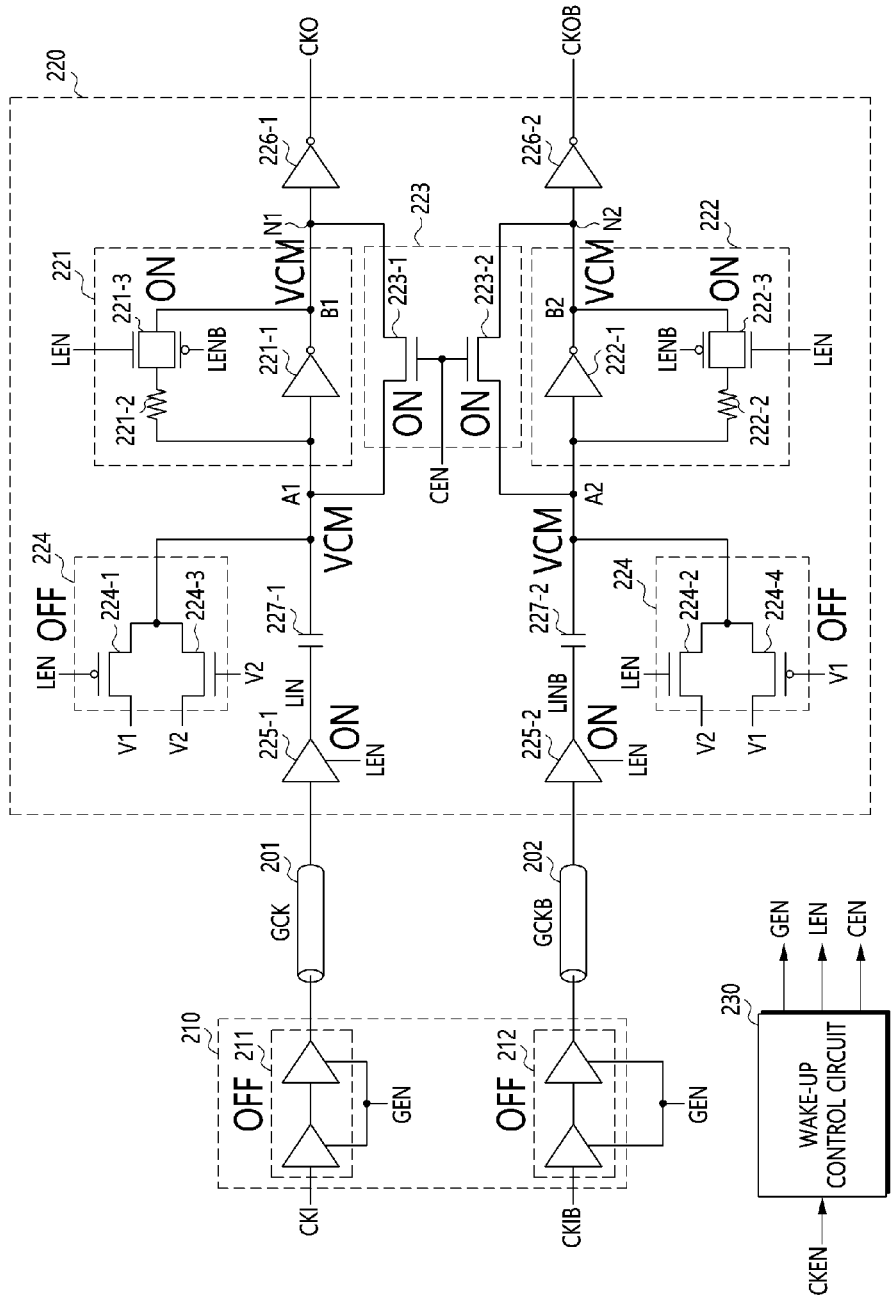
Figure 4C:
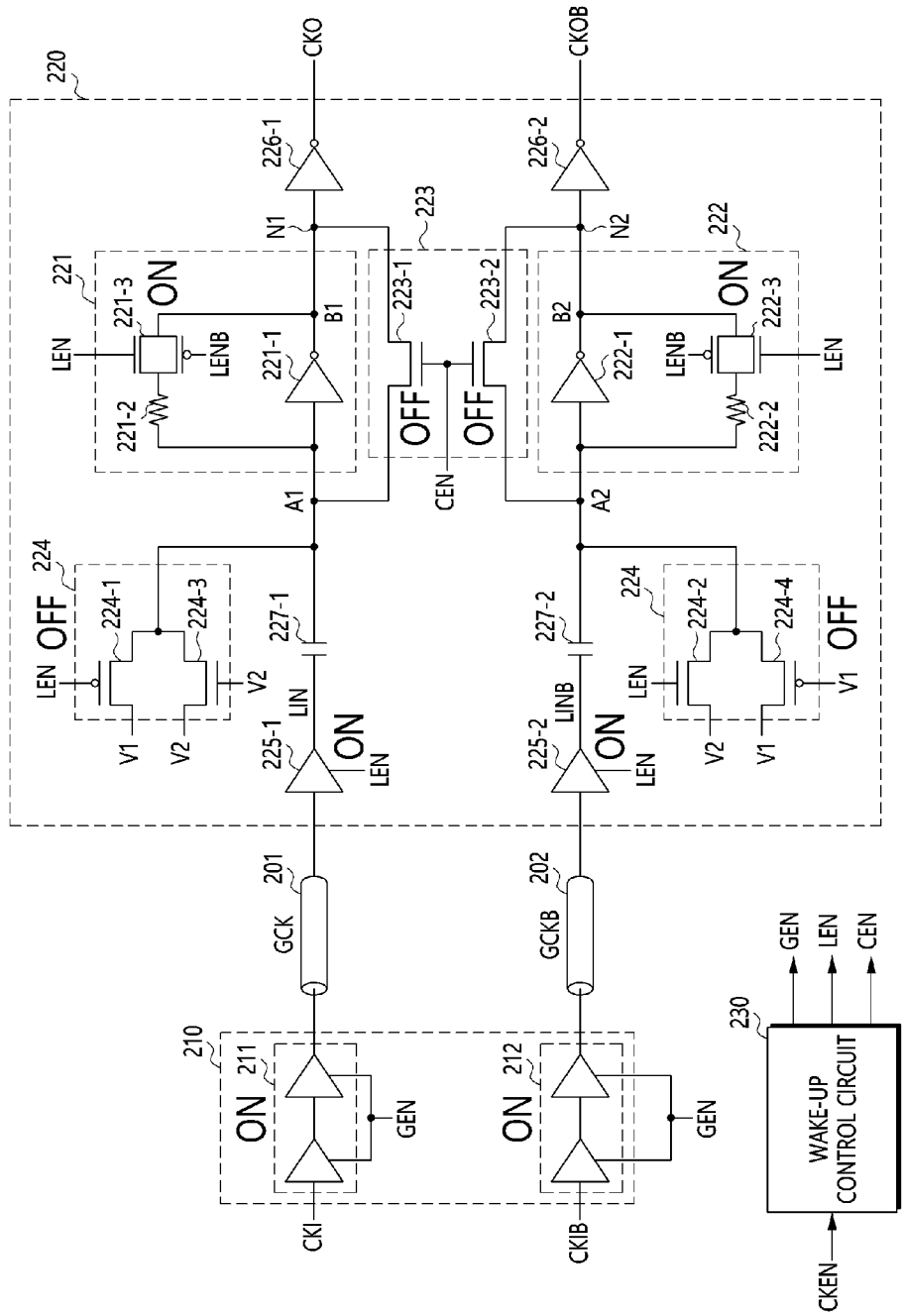

FIGS. 4A, 4B, and 4C are diagrams illustrating an operation of the clock distribution network 200 according to an embodiment of the present technology. An operation of the clock distribution network 200 according to an embodiment of the present technology will be described as follows with reference to FIGS. 2 to 4C. FIG. 4A may illustrate an operation of the clock distribution network 200 in the interval in which the clock enable signal CKEN has been disabled. The interval in which the clock enable signal CKEN has been disabled may be a deactivation interval or a partial enable interval of the clock distribution network 200. When the clock enable signal CKEN is disabled, all of the global enable signal GEN, the local enable signal LEN, and the common mode enable signal CEN may be disabled. Both the first and second global buffers 221 and 222 of the global clock tree 210 may be OFF, and the first CML buffer 225-1, second CML buffer 225-2, first pass gate 221-3, and second pass gate 222-3 of the local clock tree 220 may also be OFF. The first and second transistors 223-1 and 223-2 of the common mode setting circuit 223 may also be OFF. The first and second transistors 224-1 and 224-2 of the precharge circuit 224 may be ON. The first transistor 224-1 may precharge the voltage level of the input terminal A1 of the first converter 221 to the first voltage V1, and the second transistor 224-2 may precharge the voltage level of the input terminal A2 of the second converter 222 to the second voltage V2. The first inverter 221-1 may precharge the voltage level of the output terminal B1 of the first converter 221 and/or the first output node N1 to the second voltage V2 according to the voltage level of the input terminal A1 of the first converter 221. The second inverter 221-2 may precharge the voltage level of the output terminal B2 of the second converter 222 and/or the second output node N2 to the first voltage V1 according to the voltage level of the input terminal A2 of the second converter 222. Accordingly, the voltage levels of each of the input terminals A1 and A2 of the first and second converters 221 and 222, the first and second output nodes N1 and N2, and the first and second output clock signals CKO and CKOB may be maintained at opposite logic levels.

FIG. 4B may illustrate an operation of the clock distribution network 200 in the interval in which the clock enable signal CKEN has been enabled and the local enable signal LEN and the common mode enable signal CEN have been enabled, but the global enable signal GEN has been disabled. The interval in which the local enable signal LEN and the common mode enable signal CEN have been enabled and the global enable signal GEN has been disabled may be a wake-up interval and/or partial activation interval of the clock distribution network 200. In the wake-up interval, both the first and second global buffers 211 and 212 of the global clock tree 210 may maintain the OFF state. The first and second transistors 224-1 and 224-2 of the precharge circuit 224 of the local clock tree 220 may be OFF, and the precharge states of the input terminals A1 and A2 of the first and second converters 221 and 222 may be released. All of the first CML buffer 225-1, the second CML buffer 225-2, the first pass gate 221-3, the second pass gate 222-3, and the first and second transistors 223-1 and 223-2 of the common mode setting circuit 223 may be ON. As the first and second transistors 223-1 and 223-2 be ON, the first transistor 223-1 may couple the input terminal A1 to output terminal B1 of the first converter 221, and the second transistor 223-2 may couple the input terminal A2 to output terminal B2 of the second converter 222. Because the input terminal A1 of the first converter 221 is in the state in which the input terminal A1 has been precharged to the first voltage V1 and the output terminal B2 of the second converter 222 is in the state in which the output terminal B2 has been precharged to the second voltage V2, the input terminal A1 and output terminal B1 of the first converter 221 may be coupled, and the voltage levels of the input terminal A1 and output terminal B1 of the first converter 221 may be equalized at the common mode voltage level VCM. Likewise, because the input terminal A2 of the second converter 222 is in the state in which the input terminal A2 has been precharged to the second voltage V2 and the output terminal B2 of the second converter 222 is in the state in which the output terminal B2 has been precharged to the first voltage V1, the input terminal A2 and output terminal B2 of the second converter 222 may be coupled, and the voltage levels of the input terminal A2 and output terminal B2 of the second converter 222 may be equalized at the common mode voltage level VCM. Furthermore, the voltage levels of the first and second output clock signals CKO and CKOB may also be equalized at the common mode voltage level VCM.

FIG. 4C may illustrate an operation of the clock distribution network 200 in the interval in which the local enable signal LEN and the global enable signal GEN have been enabled and the common mode enable signal CEN has been disabled. The interval in which the global enable signal GEN has been enabled and the common mode enable signal CEN has been disabled may be a full activation interval of the clock distribution network 200. When the global enable signal GEN is enabled, both the first and second global buffers 211 and 212 of the global clock tree 210 may be ON, the first global buffer 211 may generate the first global clock signal GCK, and the second global buffer 212 may generate the second global clock signal GCKB. The first CML buffer 225-1 of the local clock tree 220 may buffer the first global clock signal GCK and may provide the buffered signal LIN to the first converter 221. The second CML buffer 225-2 of the local clock tree 220 may buffer the second global clock signal GCKB and may provide the buffered signal LINB to the second converter 222. Because the input terminals A1 and A2 of the first and second converters 221 and 222 are in the state in which the voltage levels of the input terminals A1 and A2 have been set as the common mode voltage level, the voltage levels of the input terminals A1 and A2 of the first and second converters 221 and 222 may be rapidly changed to opposite logic levels according to the logic levels of the buffered signals LIN and LINB. The first converter 221 may convert the voltage level of the buffered first global clock signal to the CMOS level, and the second converter 222 may convert the voltage level of the buffered second global clock signal to the CMOS level. At this time, because the output terminals B1 and B2 of the first and second converters 221 and 222 are also in the state in which the voltage levels of the output terminals B1 and B2 have been set as the common mode voltage level, the voltage levels of the output terminals B1 and B2 of the first and second converters 221 and 222 may also be rapidly changed to different logic levels. The third inverter 226-1 may generate the first output clock signal CKO by inverting and driving a signal that is output by the output terminal B1 of the first converter 221. The fourth inverter 226-2 may generate the second output clock signal CKOB by inverting and driving a signal that is output by the output terminal B2 of the second converter 222.

Figure 5B:
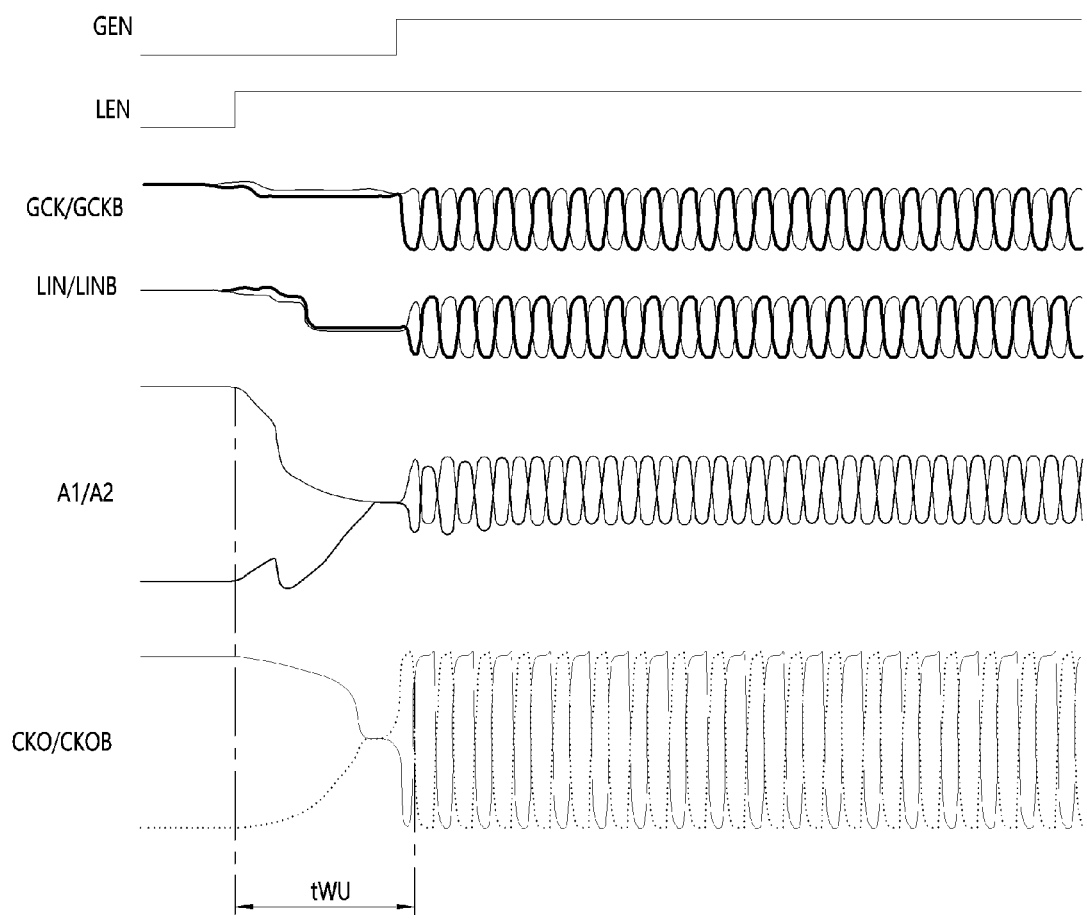
FIG. 5B is a waveform diagram illustrating an operation of the clock distribution network according to an embodiment of the present technology.

FIG. 5A is a waveform diagram illustrating an operation of a common clock distribution network. FIG. 5B is a waveform diagram illustrating an operation of the clock distribution network 200 according to an embodiment of the present technology. Referring to FIG. 5A, in the common clock distribution network, when a global clock tree and a local clock tree are deactivated, first and second global clock signals GCK' and GCKB' may be maintained at a high logic level, and the voltage levels of input terminals A1' and A2' of converters of the local clock tree might not be defined. In the common clock distribution network, the global clock tree and the local clock tree may be simultaneously enabled and the first and second global clock signals GCK' and GCKB' may be generated. However, it may take a long time for the amplitudes of the input terminals A1' and A2' of the converters to converge. Accordingly, while the amplitudes of the input terminals A1' and A2' are converging, output clock signals CKO' and CKOB' might not toggle according to the first and second global clock signals GCK' and GCKB' but may be fixed at opposite levels. When the amplitudes of the input terminals A1' and A2' of the converters have converged, the output clock signals CKO' and CKOB' may toggle in a normal state in a similar manner as the first and second global clock signals GCK' and GCKB'. Accordingly, the common clock distribution network may require a long wake-up time tWU', and operational reliability of a semiconductor device including the common clock distribution network may be degraded.

Referring to FIG. 5B, in the clock distribution network 200 according to an embodiment of the present technology, when the global clock tree 210 is deactivated and the local clock tree 220 is deactivated or partially activated, the precharge circuit 224 may precharge the voltage levels of the input terminals A1 and A2 of the first and second converters 221 and 222 to opposite logic levels. When the clock enable signal CKEN is enabled, the local enable signal LEN may be enabled before the global enable signal GEN is enabled. When the local enable signal LEN is enabled, the voltage levels of the input terminals A1 and A2 of the first and second converters 221 and 222 and the output terminals B1 and B2 of the first and second converters 221 and 222 may be set as the common mode voltage level. The first and second CML buffers 225-1 and 225-2 may be activated based on the local enable signal LEN, but the first and second global clock signals GCK and GCKB might not be toggled. Accordingly, the voltage levels of the buffered signals LIN and LINB may be set as the common mode voltage level according to the voltage levels of the input terminals A1 and A2 of the first and second converters 221 and 222.

Thereafter, when the global enable signal GEN is enabled, the first and second global clock signals GCK and GCKB may be generated, and the voltage levels of the buffered signals LIN and LINB and the input terminals A1 and A2 of the first and second converters 221 and 222 may be changed from the common mode voltage level to a high logic level or a low logic level so that the amplitudes of the input terminals A1 and A2 of the first and second converters 221 and 222 may be rapidly converged. Accordingly, the first and second output clock signals CKO and CKOB that have been balanced between a high logic level and a low logic level can be rapidly generated from the output terminals B1 and B2 of the first and second converters 221 and 222. The clock distribution network 200 according to an embodiment of the present technology may have a very short wake-up time tWU, and performance of a semiconductor device including the clock distribution network 200 can be improved.

Figure 6:
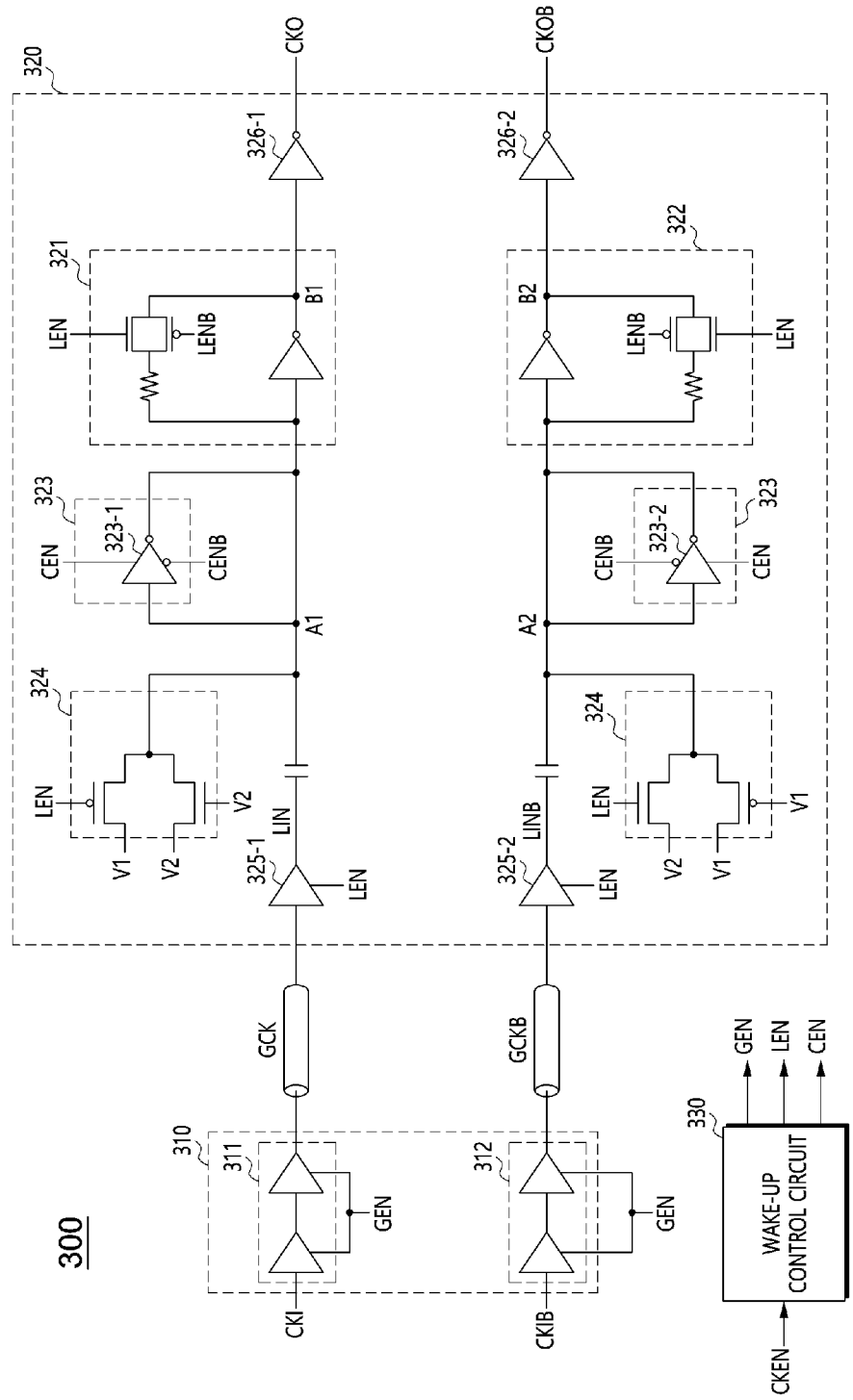
FIG. 6 is a diagram illustrating a construction of the clock distribution network according to an embodiment of the present technology.

FIG. 6 is a diagram illustrating a construction of a clock distribution network 300 according to an embodiment of the present technology. The clock distribution network 300 may be applied as the clock distribution network 122 as illustrated in FIG. 1. Referring to FIG. 6, the clock distribution network 300 may include a global clock tree 310, a local clock tree 320, and a wake-up control circuit 330. The global clock tree 310 may include first and second global buffers 311 and 312 and may generate first and second global clock signals GCK and GCKB by receiving first and second input clock signals CKI and CKIB. The local clock tree 320 may receive the first and second global clock signals GCK and GCKB and may generate first and second output clock signals CKO and CKOB. The local clock tree 320 may include a first converter 321, a second converter 322, a common mode setting circuit 323, a precharge circuit 324, a first CML buffer 325-1, and a second CML buffer 325-2. The clock distribution network 300 may have substantially the same construction as the clock distribution network 200, illustrated in FIG. 2, except for the common mode setting circuit 323 of the local clock tree 320. The same components as those of the clock distribution network 200 in FIG. 2 are assigned reference numerals similar to those of the clock distribution network 200 in FIG. 2, and a description of the same components has been omitted.

The common mode setting circuit 323 may receive a common mode enable signal CEN and may set the voltage levels of input terminals A1 and A2 of the first and second converters 321 and 322 as a common mode voltage level based on the common mode enable signal CEN. When the common mode setting circuit 323 sets the voltage levels of the input terminals A1 and A2 of the first and second converters 321 and 322 as the common mode voltage level, the voltage levels of the first and second output nodes N1 and N2 may also be set as the common mode voltage level by the first and second converters 321 and 322. When the common mode enable signal CEN is enabled, the common mode setting circuit 323 may set each of the voltage level of the input terminal A1 of the first converter 321 and the voltage level of the input terminal A2 of the second converter 322 as the common mode voltage level. When the common mode enable signal CEN is disabled, the common mode setting circuit 323 may stop setting the voltage levels of the input terminals A1 and A2 of the first and second converters 321 and 322 as the common mode voltage level.

The common mode setting circuit 323 may include a first three-state inverter 323-1 and a second three-state inverter 323-2. The first three-state inverter 323-1 may receive the common mode enable signal CEN and a complementary signal CENB as a control signal. An input terminal and output terminal of the first three-state inverter 323-1 may be coupled to the input terminal A1 of the first converter 321 in common. When the common mode enable signal CEN is enabled to a high logic level and the complementary signal CENB is disabled to a low logic level, the first three-state inverter 323-1 may set the voltage level of the input terminal A1 of the first converter 321 as the common mode voltage level by equalizing the voltage level of the input terminal A1 of the first converter 321. The second three-state inverter 323-2 may receive the common mode enable signal CEN and the complementary signal CENB as a control signal. An input terminal and output terminal of the second three-state inverter 323-2 may be coupled to the input terminal A2 of the second converter 322 in common. When the common mode enable signal CEN is enabled to a high logic level and the complementary signal CENB is disabled to a low logic level, the second three-state inverter 323-2 may set the voltage level of the input terminal A2 of the second converter 322 as the common mode voltage level by equalizing the voltage level of the input terminal A2 of the second converter 322.

Figure 7:
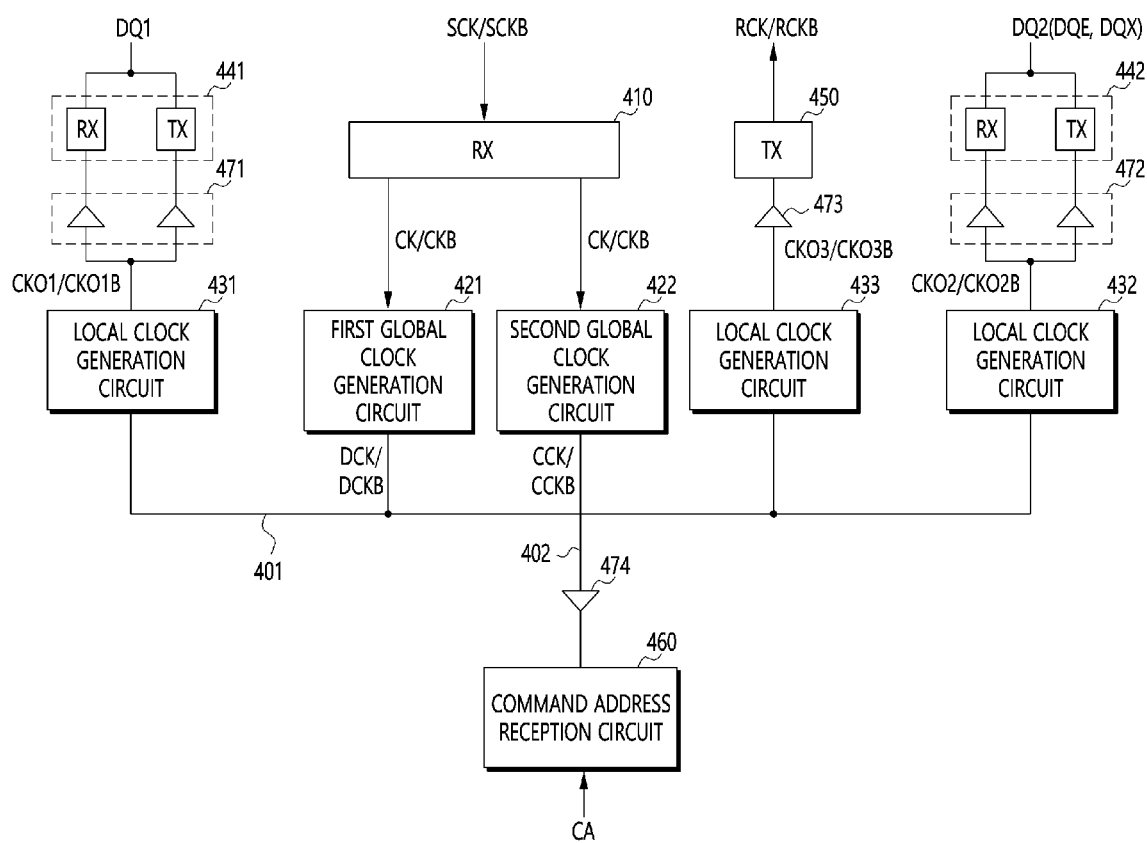
FIG. 7 is a diagram illustrating a construction of a semiconductor device according to an embodiment of the present technology.

FIG. 7 is a diagram illustrating a construction of a semiconductor device 400 according to an embodiment of the present technology. The semiconductor device 400 may be applied as the second semiconductor device 120 as illustrated in FIG. 1. Referring to FIG. 7, the semiconductor device 400 may include a clock reception circuit 410, a first global clock generation circuit 421, a second global clock generation circuit 422, a plurality of local clock generation circuits 431, 432, and 433, a plurality of data input/output circuits 441 and 442, a strobe transmission circuit 450, and a command address reception circuit 460. The first and second global clock generation circuits 421 and 422 may constitute a global clock tree. The plurality of local clock generation circuits 431, 432, and 433 may constitute a local clock tree. The clock reception circuit 410, the first and second global clock generation circuits 421 and 422, and the plurality of local clock generation circuits 431, 432, and 433 may constitute a clock distribution network. The clock reception circuit 410 may receive the system clock signal SCK and the complementary signal SCKB. The clock reception circuit 410 may generate a reference clock signal pair CK and CKB by differentially amplifying the system clock signal SCK and the complementary signal SCKB. The reference clock signal pair CK and CKB may be provided to the first and second global clock generation circuits 421 and 422, respectively.

The first global clock generation circuit 421 may receive the reference clock signal pair CK and CKB from the clock reception circuit 410 and may generate a first global clock signal pair DCK and DCKB by buffering the reference clock signal pair CK and CKB. Through a first clock transmission line 401, the first global clock generation circuit 421 may distribute and transmit the first global clock signal pair DCK and DCKB to the plurality of local clock generation circuits 431, 432, and 433 that are coupled to the data input/output circuits 441 and 442 and the strobe transmission circuit 450. The first global clock signal pair DCK and DCKB may be signals that swing at the CML level and may be a data clock signal pair.

The second global clock generation circuit 422 may receive the reference clock signal pair CK and CKB from the clock reception circuit 410 and may generate a second global clock signal pair CCK and CCKB by buffering the reference clock signal pair CK and CKB. The second global clock generation circuit 422 may distribute and transmit the second global clock signal pair CCK and CCKB to the command address reception circuit 460 through a second clock transmission line 402. The second global clock signal pair CCK and CCKB may be signals that swing at the CML level or the CMOS level and may be a command clock signal pair. In an embodiment, the second global clock generation circuit 422 may generate the second global clock signal pair CCK and CCKB by dividing the reference clock signal pair CK and CKB. The second global clock signal pair CCK and CCKB may have a lower frequency than the first global clock signal pair DCK and DCKB.

The local clock generation circuit 431 may be coupled to the data input/output circuit 441. The local clock generation circuit 431 may receive the first global clock signal pair DCK and DCKB that is transmitted through the first clock transmission line 401. The local clock generation circuit 431 may generate the local clock signal pair CKO1 and CKO1B by converting the first global clock signal pair DCK and DCKB that swings at the CML level to a signal that swings at the CMOS level. The local clock generation circuit 431 may provide the local clock signal pair CKO1 and CKO1B to the data input/output circuit 441. The semiconductor device 400 may further include a buffer 471 in order to buffer the local clock signal pair CKO1 and CKO1B that is transmitted from the local clock generation circuit 431 to the data input/output circuit 441. The data input/output circuit 441 may include a data receiver RX and a data transmitter TX. The data receiver RX and the data transmitter TX may receive the local clock signal pair CKO1 and CKO1B, respectively, from the local clock generation circuit 431. The data receiver RX and the data transmitter TX may be coupled in common to a data bus through which data DQ1 is transmitted. The data receiver RX may receive the data DQ1 that is transmitted through the data bus, in synchronization with the local clock signal pair CKO1 and CKO1B. The data transmitter TX may transmit the data DQ1 through the data bus in synchronization with the local clock signal pair CKO1 and CKO1B.

The local clock generation circuit 432 may be coupled to the data input/output circuit 442. The local clock generation circuit 432 may receive the first global clock signal pair DCK and DCKB that is transmitted through the first clock transmission line 401. The local clock generation circuit 432 may generate a local clock signal pair CKO2 and CKO2B by converting the first global clock signal pair DCK and DCKB that swings at the CML level to a signal that swings at the CMOS level. The local clock generation circuit 432 may provide the local clock signal pair CKO2 and CKO2B to the data input/output circuit 442. The semiconductor device 400 may further include a buffer 472 in order to buffer the local clock signal pair CKO2 and CKO2B that is transmitted from the local clock generation circuit 432 to the data input/output circuit 442. The data input/output circuit 442 may include a data receiver RX and a data transmitter TX. The data receiver RX and the data transmitter TX may receive the local clock signal pair CKO2 and CKO2B, respectively, from the local clock generation circuit 432. The data receiver RX and the data transmitter TX may be coupled, in common, to a data bus through which data DQ2 is transmitted. The data receiver RX may receive the data DQ2 that is transmitted through the data bus, in synchronization with the local clock signal pair CKO2 and CKO2B. The data transmitter TX may transmit the data DQ2 through the data bus in synchronization with the local clock signal pair CKO2 and CKO2B. In an embodiment, the data input/output circuit 442 may be an extension data input/output circuit. Bandwidth extension data DQE or DQX may be transmitted and received through the extension data input/output circuit. The bandwidth extension data DQE or DQX may be added, or a different type of a data signal may be added in order to extend the data bandwidth of the semiconductor device 400.

The local clock generation circuit 433 may be coupled to the strobe transmission circuit 450. The local clock generation circuit 433 may receive the first global clock signal pair DCK and DCKB that is transmitted through the first clock transmission line 401. The local clock generation circuit 433 may generate a local clock signal pair CKO3 and CKO3B by converting the first global clock signal pair DCK and DCKB that swings at the CML level to a signal that swings at the CMOS level. The local clock generation circuit 433 may provide the local clock signal pair CKO3 and CKO3B to the strobe transmission circuit 450. The semiconductor device 400 may further include a buffer 473 in order to buffer the local clock signal pair CKO3 and CKO3B that is transmitted from the local clock generation circuit 433 to the strobe transmission circuit 450. The strobe transmission circuit 450 may include a strobe transmitter TX. The strobe transmitter TX may receive the local clock signal pair CKO3 and CKO3B from the local clock generation circuit 433. The strobe transmitter TX may be coupled to a strobe bus through which data strobe signals RCK and RCKB are transmitted. The data strobe signals RCK and RCKB may be synchronized with the data DQ1, DQ2, DQE, or DQX that are transmitted through the data transmitters TX. The strobe transmitter TX may generate the data strobe signals RCK and RCKB from the local clock signal pair CKO3 and CKO3B and may transmit the data strobe signals RCK and RCKB through the strobe bus.

The command address reception circuit 460 may receive the second global clock signal pair CCK and CCKB from the second global clock generation circuit 422 through the second clock transmission line 402. The command address reception circuit 460 may be coupled to a command address bus through which the command address signal CA is transmitted. The command address reception circuit 460 may receive the command address signal CA and may latch the command address signal CA in synchronization with the second global clock signal pair CCK and CCKB. The semiconductor device 400 may further include a buffer 474 in order to buffer the second global clock signal pair CCK and CCKB that is provided from the second global clock generation circuit 422 to the command address reception circuit 460.

The data input/output circuit 441 and 442 and the strobe transmission circuit 450 may be circuits that operate at a high speed. Accordingly, although the semiconductor device 400 operates in the low power mode or a standby mode in which a data input/output operation is not performed, the clock distribution network having a relatively long wake-up time needs to maintain an activation state without being deactivated. Accordingly, in the low power mode or the standby mode of the semiconductor device 400, the data input/output circuits 441 and 442, the strobe transmission circuit 450, and the buffers 471, 472, and 473 may be OFF, but the first global clock generation circuit 421 and the plurality of local clock generation circuits 431, 432, and 433 need to maintain an ON state. Accordingly, power consumption of the semiconductor device 400 may be increased due to the components that maintain the ON state. However, the clock distribution network having a reduced wake-up time may be deactivated in the low power mode or standby mode of the semiconductor device 400. In the low power mode or standby mode of the semiconductor device 400, the first global clock generation circuit 421 and the plurality of local clock generation circuits 431, 432, and 433 may also be OFF. Accordingly, components that maintain the ON state can be greatly reduced, and power consumption of the semiconductor device 400 can be dramatically reduced.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A clock distribution network comprising:
   a wake-up control circuit configured to generate a global enable signal and a local enable signal based on a clock enable signal;
   a global clock tree configured to buffer a first input clock signal and a second input clock signal based on the global enable signal to generate a first global clock signal and a second global clock signal; and
   a local clock tree configured to set voltage levels of a first output clock signal and a second output clock signal as a common mode voltage level based on the local enable signal and the global enable signal and configured to generate the first and second output clock signal from the first and second global clock signals based on the global enable signals.

2. The clock distribution network according to claim 1, wherein, when the clock enable signal is enabled, the wake-up control circuit enables the local enable signal before enabling the global enable signal.

3. The clock distribution network according to claim 2, wherein the wake-up control circuit further generates a common enable signal that is enabled in an interval from a time at which the local enable signal is enabled to a time at which the global enable signal is enabled, and
   wherein the local clock tree sets the voltage levels of the first and second output clock signals as the common mode voltage level when the common enable signal is enabled.

4. The clock distribution network according to claim 1, wherein the global clock tree and the local clock tree receive a first voltage and a second voltage having a lower voltage level than the first voltage, and
   wherein the common mode voltage level is a middle voltage level between the first and second voltages.

5. The clock distribution network according to claim 1, wherein, when the clock enable signal is disabled, the local clock tree precharges voltage levels of the first and second output clock signals to opposite logic levels.

6. The clock distribution network according to claim 1, wherein the global clock tree comprises:
   a first global buffer configured to generate the first global clock signal by buffering the first input clock signal to a current mode logic (CML) level based on the global enable signal; and
   a second global buffer configured to generate the second global clock signal by buffering the second input clock signal to the CML level based on the global enable signal.

7. The clock distribution network according to claim 1, wherein the local clock tree comprises:
   a first converter configured to generate the first output clock signal by converting a voltage level of the first global clock signal to a complementary metal-oxide-semiconductor (CMOS) level based on the local enable signal;
   a second converter configured to generate the second output clock signal by converting a voltage level of the second global clock signal to the CMOS level based on the local enable signal; and
   a common mode setting circuit configured to, based on the local enable signal and the global enable signal, couple an input terminal of the first converter to an output terminal of the first converter and couple an input terminal of the second converter to an output terminal of the second converter.

8. The clock distribution network according to claim 7, further comprising a precharge circuit configured to, based on the local enable signal, set a voltage level of the input terminal of the first converter as a voltage level of a first voltage and precharge a voltage level of the input terminal of the second converter to a voltage level of a second voltage having a logic level that is opposite to a logic level of the first voltage.

9. The clock distribution network according to claim 1, wherein the local clock tree comprises:
a first converter configured to generate the first output clock signal by converting a voltage level of the first global clock signal to a CMOS level based on the local enable signal;
a second converter configured to generate the second output clock signal by converting a voltage level of the second global clock signal to the CMOS level based on the local enable signal; and
a common mode setting circuit configured to set voltage levels of an input terminal of the first converter and an input terminal of the second converter as the common mode voltage level based on the local enable signal and the global enable signal.

10. The clock distribution network according to claim 9, further comprising a precharge circuit configured to, based on the local enable signal, set the voltage level of the input terminal of the first converter as a voltage level of a first voltage and precharge a voltage level of the input terminal of the second converter to a second voltage having a logic level that is opposite to the logic level of the first voltage.

11. A clock distribution network comprising:
a wake-up control circuit configured to generate a global enable signal, a local enable signal, and a common mode enable signal based on a clock enable signal;
a global clock tree configured to buffer a first input clock signal and a second input clock signal based on the global enable signal to generate a first global clock signal and a second global clock signal; and
a local clock tree configured to set voltage levels of a first output clock signal and a second output clock signal as opposite logic levels based on the clock enable signal, set the voltage levels of the first and second output clock signals as a common mode voltage level based on the common mode enable signal, and generate the first and second output clock signals from the first and second global clock signals based on the local enable signal.

12. The clock distribution network according to claim 11, wherein the wake-up control circuit:
disables all of the global enable signal, the local enable signal, and the common mode enable signal when the clock enable signal is disabled, and
enables the global enable signal after enabling the local enable signal and the common mode enable signal when the clock enable signal is enabled.

13. The clock distribution network according to claim 12, wherein the wake-up control circuit disables the common mode enable signal when the global enable signal is enabled.

14. The clock distribution network according to claim 11, wherein the global clock tree comprises:
a first global buffer configured to generate the first global clock signal by buffering the first input clock signal to a current mode logic (CML) level when the global enable signal is enabled; and
a second global buffer configured to generate the second global clock signal by buffering the second input clock signal to the CML level when the global enable signal is enabled.

15. The clock distribution network according to claim 11, wherein the local clock tree comprises:
a first converter configured to generate the first output clock signal by converting a voltage level of the first global clock signal to a complementary metal-oxide-semiconductor (CMOS) level when the local enable signal is enabled;
a second converter configured to generate the second output clock signal by converting a voltage level of the second global clock signal to the CMOS level when the local enable signal is enabled;
a common mode setting circuit configured to, based on the common mode enable signal, couple an input terminal of the first converter to an output terminal of the first converter and couple an input terminal of the second converter to an output terminal of the second converter; and
a precharge circuit configured to precharge voltage levels of the input terminals of the first and second converters to opposite logic levels when the local enable signal is disabled.

16. The clock distribution network according to claim 15, wherein:
the precharge circuit is configured to set a voltage level of the input terminal of the first converter as a voltage level of a first voltage and set a voltage level of the input terminal of the second converter as a voltage level of a second voltage, and
the common mode voltage level is an intermediate voltage level between the first and second voltages.

17. The clock distribution network according to claim 11, wherein the local clock tree comprises:
a first converter configured to generate the first output clock signal by converting a voltage level of the first global clock signal to a CMOS level when the local enable signal is enabled;
a second converter configured to generate the second output clock signal by converting a voltage level of the second global clock signal to the CMOS level when the local enable signal is enabled;
a common mode setting circuit configured to set voltage levels of an input terminal of the first converter and an input terminal of the second converter as the common mode voltage level based on the common mode enable signal; and
a precharge circuit configured to precharge the voltage levels of the input terminals of the first and second converters to opposite logic levels when the local enable signal is disabled.

18. A clock distribution method of a clock distribution network comprising a global clock tree configured to buffer a first input clock signal and a second input clock signal to generate a first global clock signal and a second global clock signal and a local clock tree configured to generate a first output clock signal and a second output clock signal from the first and second global clock signals, the clock distribution method comprising steps of:
activating the local clock tree and setting, as a common mode voltage level, voltage levels of a first output node and a second output node from which the first and second output clock signals are output, respectively;

releasing a state in which the voltage levels of the first and second output nodes have been set as the common mode voltage level; and activating the global clock tree.

19. The clock distribution method according to claim 18, wherein the global clock tree and the local clock tree receive a first voltage and a second voltage, and wherein the common mode voltage level is a middle voltage level between the first and second voltages.

20. The clock distribution method according to claim 18, further comprising setting the voltage levels of the first and second output nodes as opposite logic levels when the global clock tree and the local clock tree are deactivated.

\* \* \* \* \*